(12) United States Patent
Yang et al.

(10) Patent No.: US 7,656,685 B2
(45) Date of Patent: *Feb. 2, 2010

(54) CONTROL METHOD AND CIRCUIT WITH INDIRECT INPUT VOLTAGE DETECTION BY SWITCHING CURRENT SLOPE DETECTION

(75) Inventors: Ta-Yung Yang, Milpitas, CA (US); Chien-Yuan Lin, Pan-Chiao (TW)

(73) Assignee: System General Corp., Taipei Hsien (TW)

( * ) Notice: Subject to any disclaimer, the term of this patent is extended or adjusted under 35 U.S.C. 154(b) by 405 days.

This patent is subject to a terminal disclaimer.

(21) Appl. No.: 11/652,571

(22) Filed: Jan. 12, 2007

(65) Prior Publication Data

US 2008/0169802 A1    Jul. 17, 2008

(51) Int. Cl.
*H02M 3/335* (2006.01)
(52) U.S. Cl. .................... 363/21.01; 363/97
(58) Field of Classification Search ............. 363/21.01, 363/21.04, 21.05, 56.1, 56.11, 97, 131
See application file for complete search history.

(56) References Cited

U.S. PATENT DOCUMENTS

| | | | |
|---|---|---|---|
| 5,903,452 A * | 5/1999 | Yang | 363/97 |
| 6,836,415 B1 * | 12/2004 | Yang et al. | 363/21.01 |
| 7,259,972 B2 * | 8/2007 | Yang | 363/21.16 |
| 7,362,592 B2 * | 4/2008 | Yang et al. | 363/21.13 |
| 7,362,593 B2 * | 4/2008 | Yang et al. | 363/21.16 |
| 7,468,896 B2 * | 12/2008 | Gong et al. | 363/21.17 |
| 2008/0169802 A1 * | 7/2008 | Yang et al. | 324/157 |

* cited by examiner

*Primary Examiner*—Jeffrey L Sterrett
(74) *Attorney, Agent, or Firm*—Rosenberg, Klein & Lee

(57) ABSTRACT

The present invention provides a method and circuit for detecting an input voltage of a power converter. It includes a current sense circuit for generating a current signal in response to a switching current of an inductive device. A detection circuit is coupled to sense the current signal for generating a slope signal in response to a slope of the current signal. A signal generation circuit is further developed to generate an input-voltage signal in accordance with the slope signal. The level of the input-voltage signal is corrected to the input voltage of the power converter.

19 Claims, 7 Drawing Sheets

CONTROL METHOD AND CIRCUIT WITH INDIRECT INPUT VOLTAGE DETECTION BY SWITCHING CURRENT SLOPE DETECTION

BACKGROUND OF THE INVENTION

1. Field of the Invention

The present invention relates to power converters, and more specifically relates to the control of switching power converters.

2. Description of Related Art

Switching power converters have been widely used to provide regulated voltage and current. A transformer (an inductive device) is used in the power converter for energy store and power transfer. FIG. 1 shows a circuit schematic of a power converter. A controller 15 generates a switching signal $S_W$ at an output terminal OUT to regulate the output of the power converter in response to a feedback signal $V_{FB}$. In general, the feedback signal $V_{FB}$ is obtained at a feedback terminal FB of the controller 15 by detecting the output voltage $V_O$ of the power converter through an optical-coupler or a feedback circuit including an auxiliary winding (Figure not shown).

The switching signal $S_W$ drives a power transistor 12 for switching a transformer 10. The transformer 10 is connected to an input voltage $V_{IN}$ of the power converter. The energy of the transformer 10 is transferred to the output voltage $V_O$ of the power converter through a rectifier 17 and a capacitor 18. A resistor $R_S$ is connected serially with the power transistor 12 to generate a current signal $V_I$ in response to a switching current $I_P$ of the transformer 10. The current signal $V_I$ is coupled to a current-sense terminal VS of the controller 15 for the control and protections of the power converter. A resistor 19 is further connected from the input voltage $V_{IN}$ to an input terminal IN of the controller 15 for over-voltage and under-voltage protections, etc.

Furthermore, the over-power protection of power converter requires sensing the input voltage $V_{IN}$ to control the maximum output power as a constant. The approach was disclosed as "PWM controller for controlling output power limit of a power supply" by Yang et al., U.S. Pat. No. 6,611,439. The drawback of this prior art is the power loss caused by the resistor 19 especially when the input voltage $V_{IN}$ is high. The object of the present invention is to sense the input voltage $V_{IN}$ without the need of the resistor 19 for saving power. Moreover, reducing input terminals of the controller 15 is another object of the present invention.

SUMMARY OF THE INVENTION

The present invention provides a method and circuit for detecting an input voltage of a power converter. It includes a current sense circuit to generate a current signal in response to a switching current of a transformer. The transformer is operated as an inductive device. A detection circuit is coupled to sense the current signal for generating a slope signal in response to a slope of the current signal. When a power transistor of the power converter is turned on, the detection circuit will sample the current signal during a first period to generate a first signal. After that, sampling the current signal during a second period will generate a second signal. The slope of the current signal is determined in accordance with the first signal and the second signal. A signal generation circuit is further utilized to generate an input-voltage signal in accordance with the slope signal. The level of the input-voltage signal is corrected to the input voltage of the power converter.

BRIEF DESCRIPTION OF THE DRAWINGS

The accompanying drawings are included to provide further understanding of the invention, and are incorporated into and constitute a part of this specification. The drawings illustrate embodiments of the invention and, together with the description, serve to explain the principles of the invention.

DESCRIPTION OF THE PREFERRED EMBODIMENTS

Figure 1:
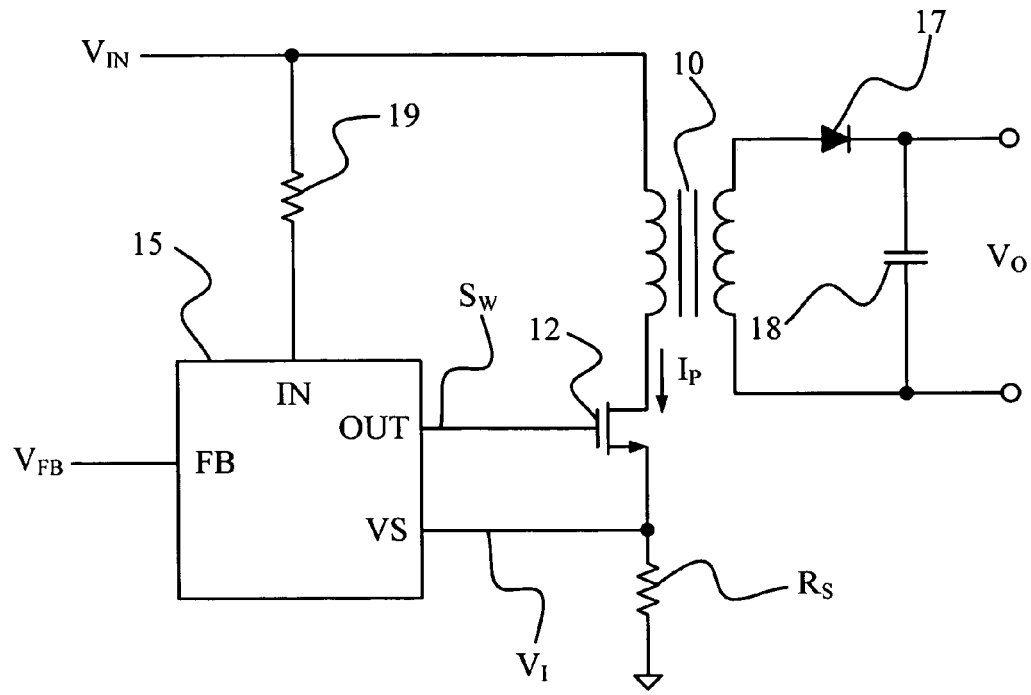
FIG. 1 shows a circuit diagram of a traditional power converter having a resistor coupled to detect the input voltage of the power converter.
Figure 2:
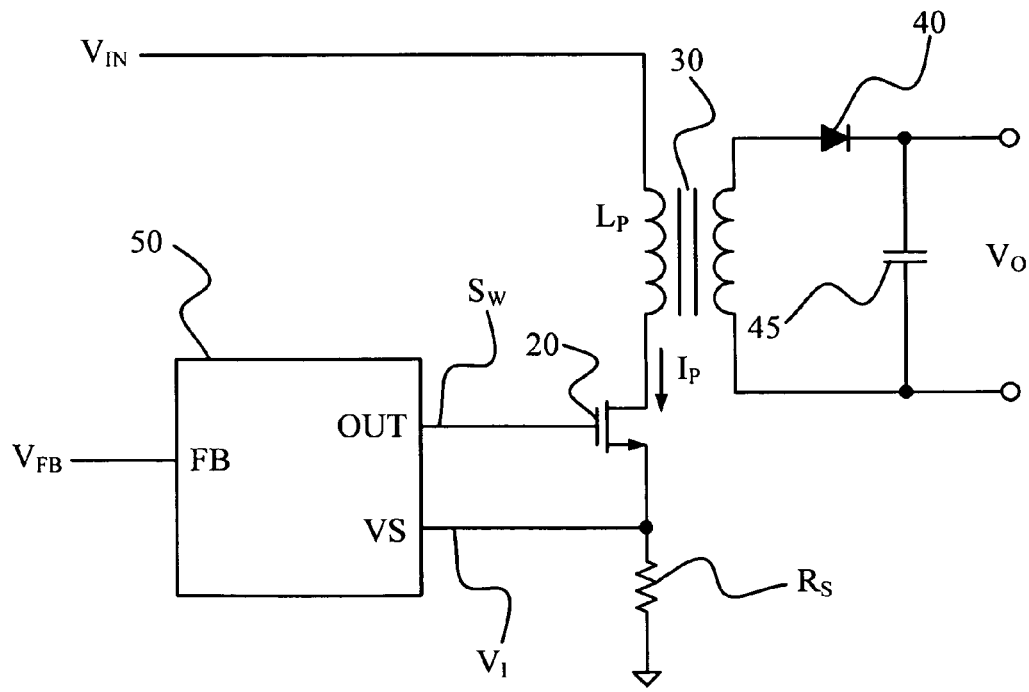
FIG. 2 shows a circuit schematic of a preferred power converter according to the present invention.

FIG. 2 shows a circuit diagram of a preferred power converter. The power converter includes a power transistor 20, a transformer 30, a rectifier 40, a capacitor 45, a switching controller 50 and a resistor $R_S$. The transformer 30 serves as an inductance device coupled to receive an input voltage $V_{IN}$. The power transistor 20 is connected serially with the transformer 30 to switch the transformer 30. The resistor $R_S$ serves as a current sense circuit connected to the power transistor 20 to develop a current signal $V_I$ in response to a switching current $I_P$ of the transformer 30. The current signal $V_I$ represents the switching current $I_P$. The current signal $V_I$ is coupled to a current-sense terminal VS of the switching controller 50 for the control and protections of the power converter. An output terminal OUT of the switching controller 50 generates a switching signal $S_W$ to control the power transistor 20 for regulating the output of the power converter in response to the current signal $V_I$ and a feedback signal $V_{FB}$. The feedback signal $V_{FB}$ is generated at a feedback terminal FB of the switching circuit 50 for the feedback regulation in response to the output of the power converter. The energy of the transformer 30 is transferred to the output voltage $V_O$ of the power converter through the rectifier 40 and the capacitor 45.

Figure 3:
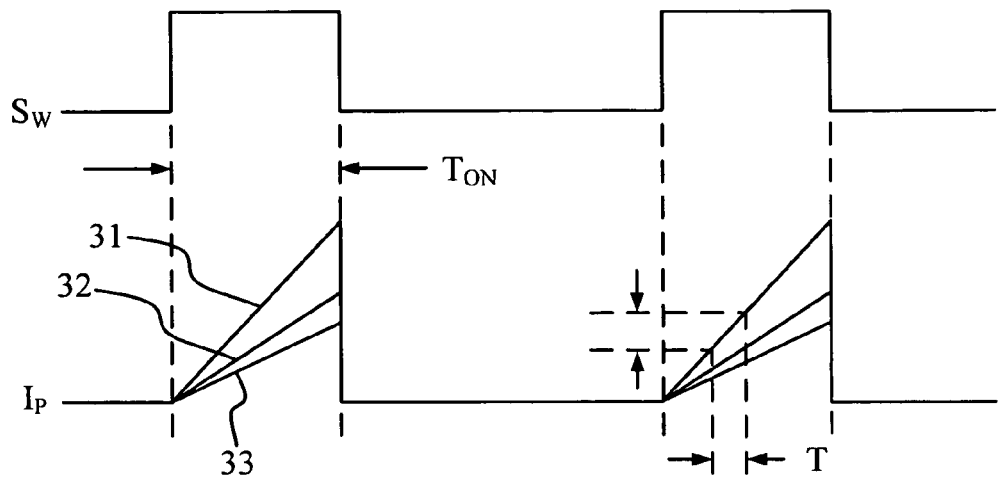
FIG. 3 shows switching current waveforms according to the present invention.

The switching controller 50 detects the input voltage $V_{IN}$ for the protections of the power converter. The input voltage $V_{IN}$ is detected by sensing a slope of the switching current $I_P$. FIG. 3 shows switching current waveforms. The slope of the switching current $I_P$ is produced in response to the level of the input voltage $V_{IN}$. For example, the slopes 31, 32 and 33 are generated in response to the input voltage $V_{IN1}$, $V_{IN2}$ and $V_{IN3}$ respectively. The level of the input voltage is $V_{IN1} > V_{IN2} > V_{IN3}$. Once the switching signal $S_W$ is turned on, the switching current $I_P$ is generated accordingly, $$I_P = \frac{V_{IN}}{L_P} \times T_{ON} \qquad (1)$$

$$V_{IN} = \frac{\Delta I \times L_P}{\Delta T} \qquad (2)$$

where $L_P$ is the inductance of the primary winding of the transformer 30; $T_{ON}$ is on time of the switching signal $S_W$.

Figure 4:
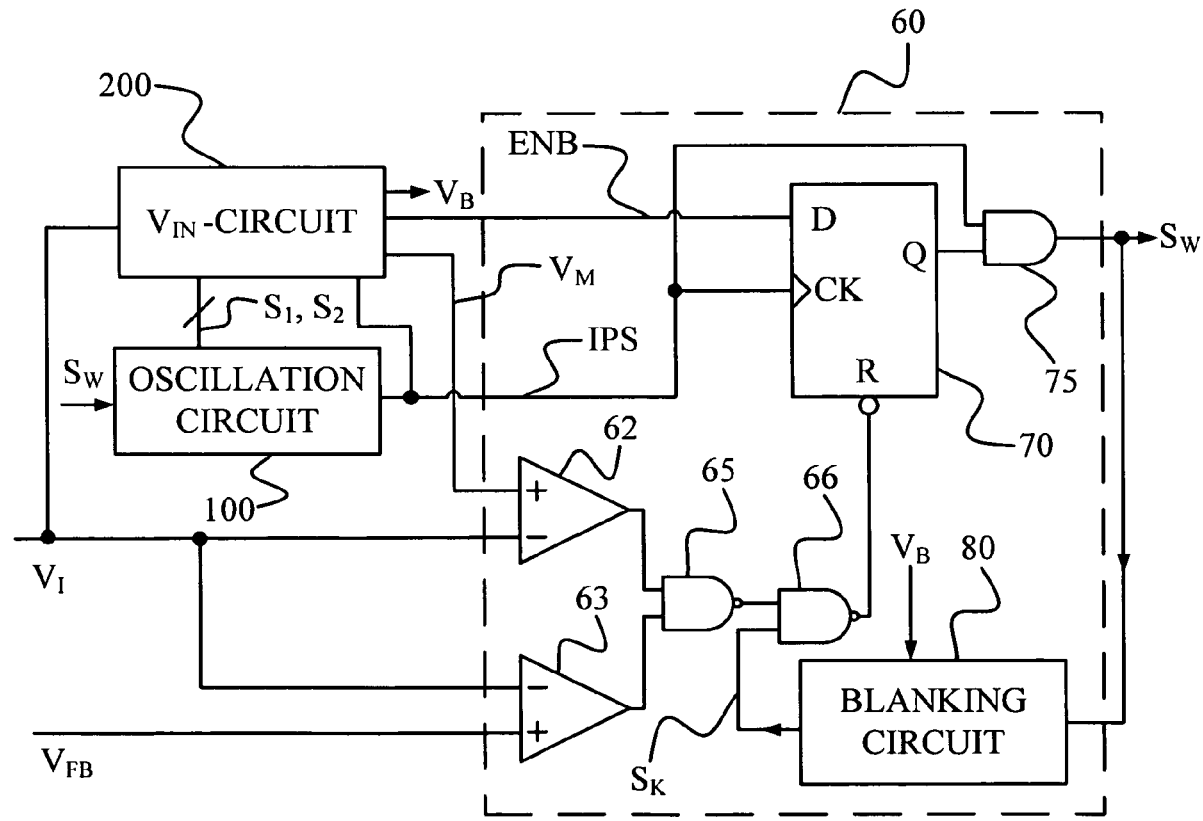
FIG. 4 shows a circuit diagram of a preferred embodiment of a switching controller according to the present invention.

FIG. 4 shows a circuit diagram of the switching controller 50. It includes a switching circuit 60 to generate the switching signal $S_W$ in response to an oscillation signal IPS. An oscillation circuit 100 is developed to generate the oscillation signal IPS and the timing signals $S_1$, $S_2$. Timing signals $S_1$ and $S_2$ serve as sample signals outputted to a $V_{IN}$-circuit 200. The $V_{IN}$-circuit 200 is coupled to receive the current signal $V_I$ for producing an input-voltage signal $V_V$ (shown in FIG. 10) in accordance with the slope of the current signal $V_I$. Meanwhile, the $V_{IN}$-circuit 200 generates a control signal ENB, a current-limit signal $V_M$ and a blanking adjustment signal $V_B$ in response to the input-voltage signal $V_V$ for power converter control and protections.

The switching circuit 60 includes a flip-flop 70 to generate the switching signal $S_W$ through an AND gate 75. The input terminal of the AND gate 75 is connected to the output terminal Q of the flip-flop 70. Another input terminal of the AND gate 75 is connected to the oscillation circuit 100 to receive the oscillation signal IPS to limit the maximum on time of the switching signal $S_W$. The input terminal D of the flip-flop 70 is coupled to the $V_{IN}$-circuit 200 to receive the control signal ENB. The flip-flop 70 is enabled in response to the oscillation signal IPS coupled to the clock input terminal CK of the flip-flop 70 if the control signal ENB is enabled. The switching signal $S_W$ will be disabled once the control signal ENB is disabled.

The switching signal $S_W$ is coupled to a blanking circuit 80 to generate a blanking signal $S_K$ in response to the switching signal $S_W$. The blanking signal $S_K$ ensures a minimum on time of the switching signal $S_W$ when the switching signal $S_W$ is enabled. The blanking adjustment signal $V_B$ is coupled to the blanking circuit 80 to adjust the blanking time of the blanking signal $S_K$. Therefore, the blanking time of the blanking signal $S_K$ will be increased in response to the decrease of the input voltage $V_{IN}$. The blanking signal $S_K$ is connected to the input terminal of an NAND gate 66.

The output terminal of the NAND gate 66 is coupled to the reset terminal R of the flip-flop 70 to reset the flip-flop 70. Another input terminal of the NAND gate 66 is connected to the output terminal of an NAND gate 65. The input terminal of the NAND gate 65 is connected to the output terminal of a comparator 62. Another input terminal of the NAND gate 65 is connected to the output terminal of a comparator 63. The comparator 62 is utilized to limit the maximum switching current $I_P$. The positive input terminal of the comparator 62 is connected to the $V_{IN}$-circuit 200 to receive the current-limit signal $V_M$. The negative input terminal of the comparator 62 and the negative input terminal of the comparator 63 are coupled to receive the current signal $V_I$. The positive input terminal of the comparator 63 is coupled to receive the feedback signal $V_{FB}$ for the feedback loop control.

Figure 5:
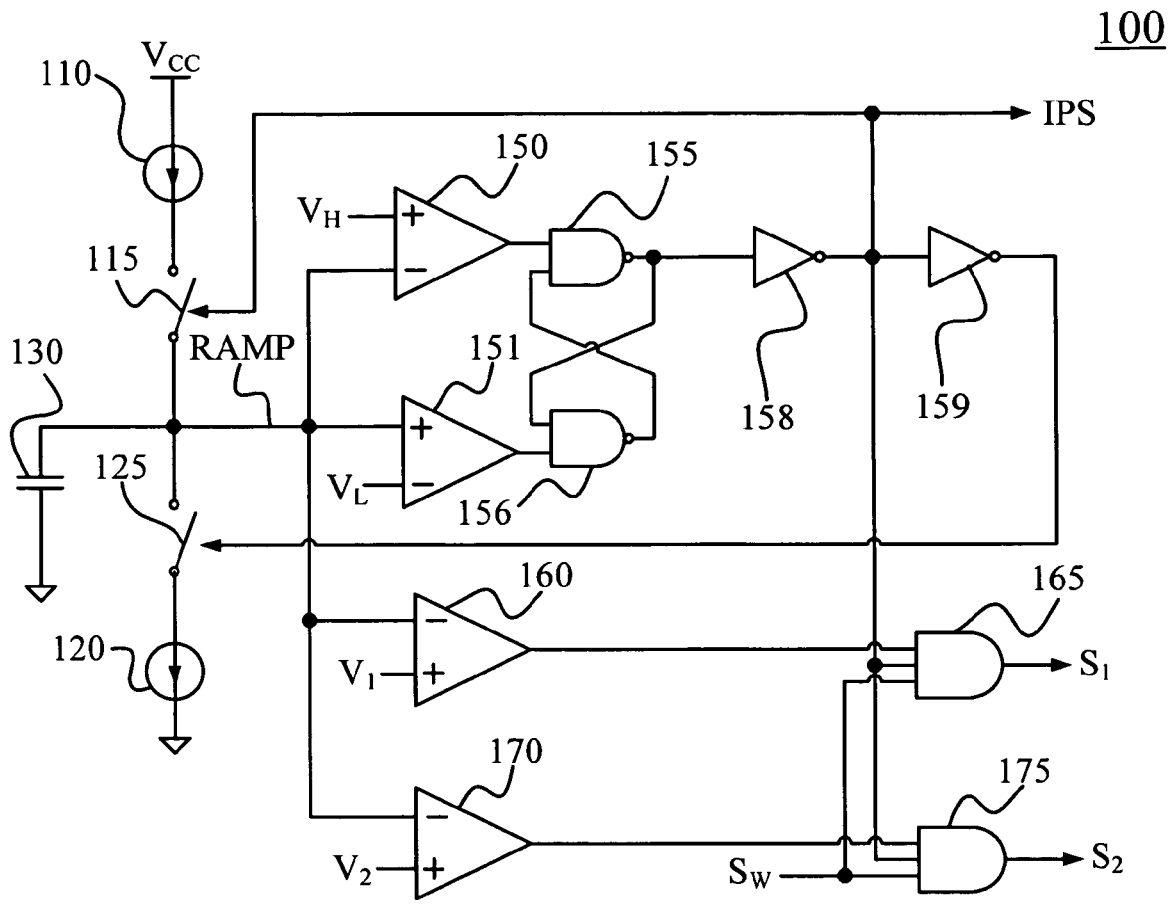
FIG. 5 shows a circuit diagram of a preferred embodiment of an oscillation circuit according to the present invention.

FIG. 5 shows the circuit diagram of the oscillation circuit 100. A charge current 110 is coupled to a supply voltage $V_{CC}$. The charge current 110 is serially connected with a switch 115 for charging a capacitor 130. A discharge current 120 is coupled to the ground. The discharge current 120 is serially connected with a switch 125 for discharging the capacitor 130. A ramp signal RAMP is therefore produced on the capacitor 130. Comparators 150, 151, NAND gates 155, 156 and an inverter 158 are used to generate the oscillation signal IPS to control the switch 115. The oscillation signal IPS is further utilized to control the switch 125 through an inverter 159. The oscillation signal IPS is further transmitted to the $V_{IN}$-circuit 200 and the switching circuit 60 respectively (shown in FIG. 4). The ramp signal RAMP is coupled to the negative input terminal of the comparator 150 and the positive input terminal of the comparator 151 respectively. Trip-point voltages $V_H$ and $V_L$ are connected to the positive input terminal of the comparator 150 and the negative input terminal of the comparator 151 respectively. The ramp signal RAMP is thus swing in between the trip-point voltages $V_H$ and $V_L$.

The input terminal of the NAND gate 155 is coupled to the output terminal of the comparator 150. The input terminal of the NAND gate 156 is coupled to the output terminal of the comparator 151. Another input terminal of the NAND gate 156 is coupled to the output terminal of the NAND gate 155. The output terminal of the NAND gate 156 is coupled to another input terminal of the NAND gate 155. The output terminal of the NAND gate 155 is coupled to the input terminal of the inverter 158. The oscillation signal IPS is generated by the output terminal of the inverter 158. The output terminal of the inverter 158 is further coupled to the input terminal of the inverter 159 to receive the oscillation signal IPS. The inverter 159 inverts the oscillation signal IPS to control switch 125.

The negative input terminals of the comparators 160 and 170 are coupled to receive the ramp signal RAMP for generating the timing signals $S_1$ and $S_2$. Threshold voltages $V_1$ and $V_2$ are connected to the positive input terminals of the comparators 160 and 170 respectively. The level of the voltage is $V_H > V_2 > V_1 > V_L$. The output terminal of the comparator 160 is connected to the input terminal of an AND gate 165 to generate the first timing signal $S_1$. The output terminal of the comparator 170 is connected to the input terminal of an AND gate 175 to generate the second timing signal $S_2$. The input terminals of the comparators 165 and 175 are further connected to receive the oscillation signal IPS and the switching signal $S_W$. Since the oscillation signal IPS is coupled to enable the switching signal $S_W$ and turn on the power transistor 20 (shown in FIG. 2), the first timing signal $S_1$ is generated during a first period $T_1$ (shown in FIG. 9) when the power transistor 20 is turned on. The second timing signal $S_2$ is produced during a second period $T_2$ (shown in FIG. 9) when the power transistor 20 is turned on. The first timing signal $S_1$ and the second timing signal $S_2$ are synchronized with the oscillation signal IPS.

Figure 6:
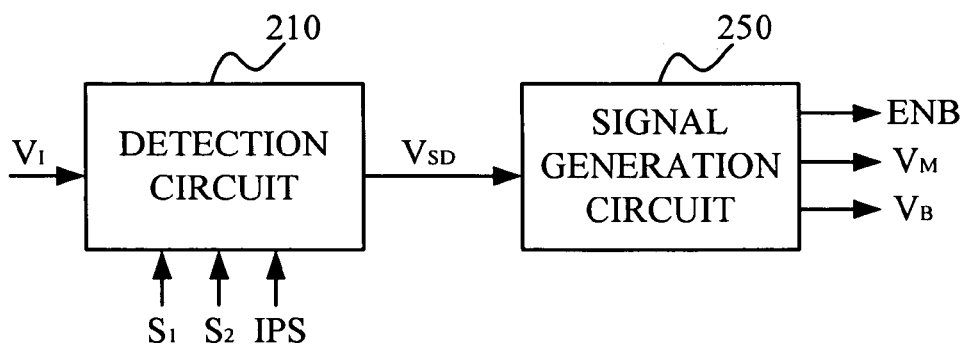
FIG. 6 shows a circuit diagram of a preferred embodiment of a $V_{IN}$-circuit according to the present invention.

FIG. 6 shows the circuit diagram of the $V_{IN}$-circuit 200. It serves as an input voltage detection circuit including a detection circuit 210 and a signal generation circuit 250. The detection circuit 210 generates a slope signal $V_{SD}$ by detecting the slope of the current signal $V_I$. The slope of the current signal $V_I$ is measured in response to the oscillation signal IPS and the timing signals $S_1$, $S_2$. The signal generation circuit 250 further receives the slope signal $V_{SD}$ to generate the input-voltage signal $V_V$ (shown in FIG. 10), the control signal ENB, the current-limit signal $V_M$ and the blanking adjustment signal $V_B$.

Figure 7:
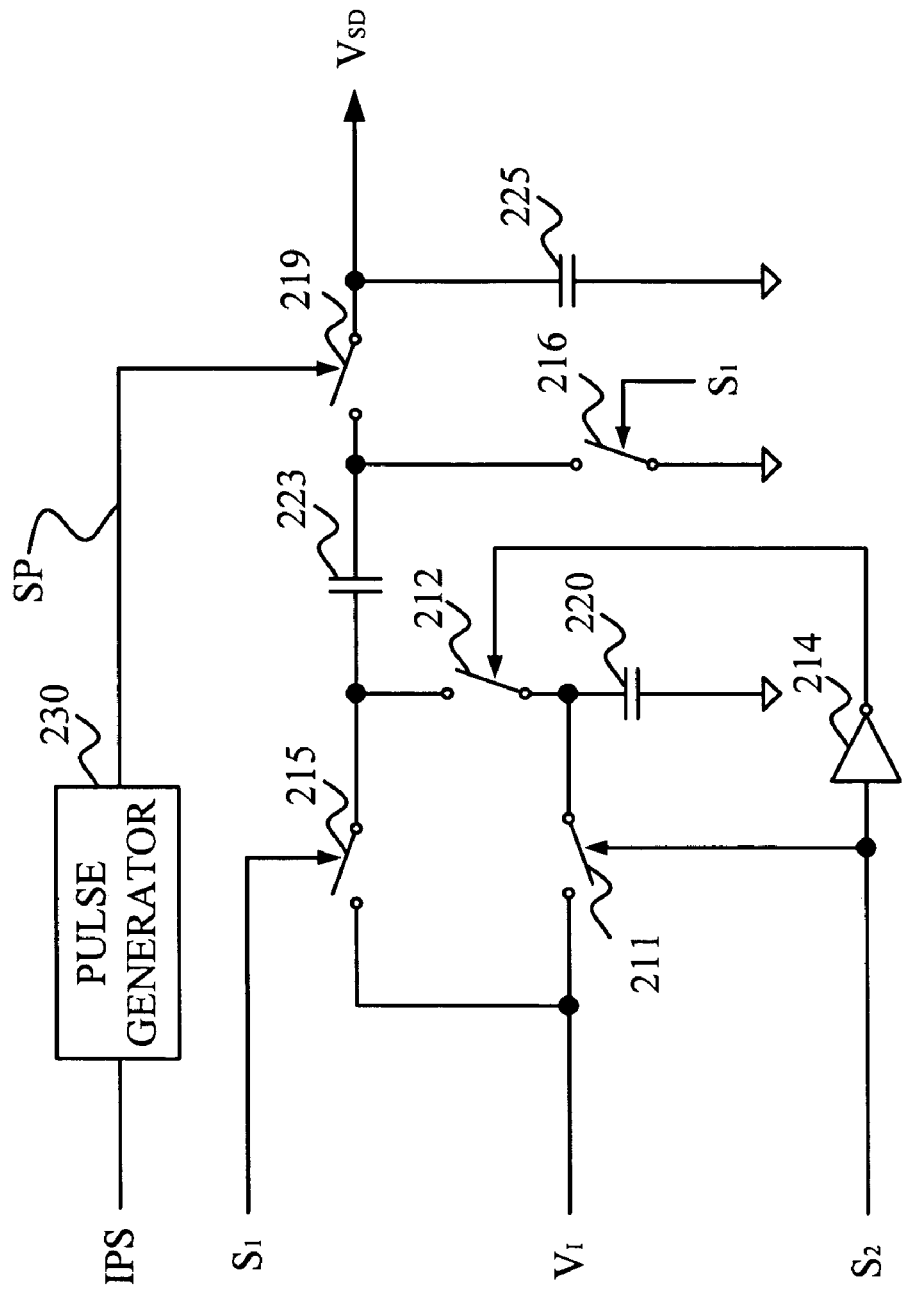
FIG. 7 shows a circuit diagram of a preferred embodiment of a detection circuit according to the present invention.

FIG. 7 is a preferred embodiment of the detection circuit 210. A first terminal of a first capacitor 223 is coupled to receive the current signal $V_I$ though a first switch 215. A second terminal of the capacitor 223 is connected to the ground via a third switch 216. A first terminal of a second capacitor 220 is coupled to receive the current signal $V_I$ as well through a second switch 211. A second terminal of the second capacitor 220 is connected to the ground. The first terminal of the second capacitor 220 is further connected to the first terminal of the first capacitor 223 through a fourth switch 212. The second switch 211 is controlled by the second timing signal $S_2$. The fourth switch 212 is controlled by the second timing signal $S_2$ through an inverter 214. Both switches 215 and 216 are controlled by the first timing signal $S_1$. A first terminal of a third capacitor 225 is coupled to the second terminal of the first capacitor 223 via a fifth switch 219. A second terminal of the third capacitor 225 is coupled to the ground. The fifth switch 219 is controlled by a pulse signal $S_P$. The pulse signal $S_P$ is produced in response to the oscillation signal IPS through a pulse generator 230. The slope signal $V_{SD}$ is generated on the third capacitor 225.

The first capacitor 223 is therefore coupled to sample-and-hold the current signal $V_I$ through the switches 215 and 216 to generate a first signal during the first period $T_1$ (shown in FIG. 9) after the power transistor 20 (shown in FIG. 2) is turned on. The second capacitor 220 is coupled to sample-and-hold the current signal $V_I$ through the second switch 211 to generate a second signal during the second period $T_2$ (shown in FIG. 9) after the power transistor 20 is turned on. The third capacitor 225 is coupled to sample-and-hold the differential voltage of the first signal and the second signal to generate the slope signal $V_{SD}$. The slope signal $V_{SD}$ is correlated to the slope of the current signal $V_I$.

Figure 8:
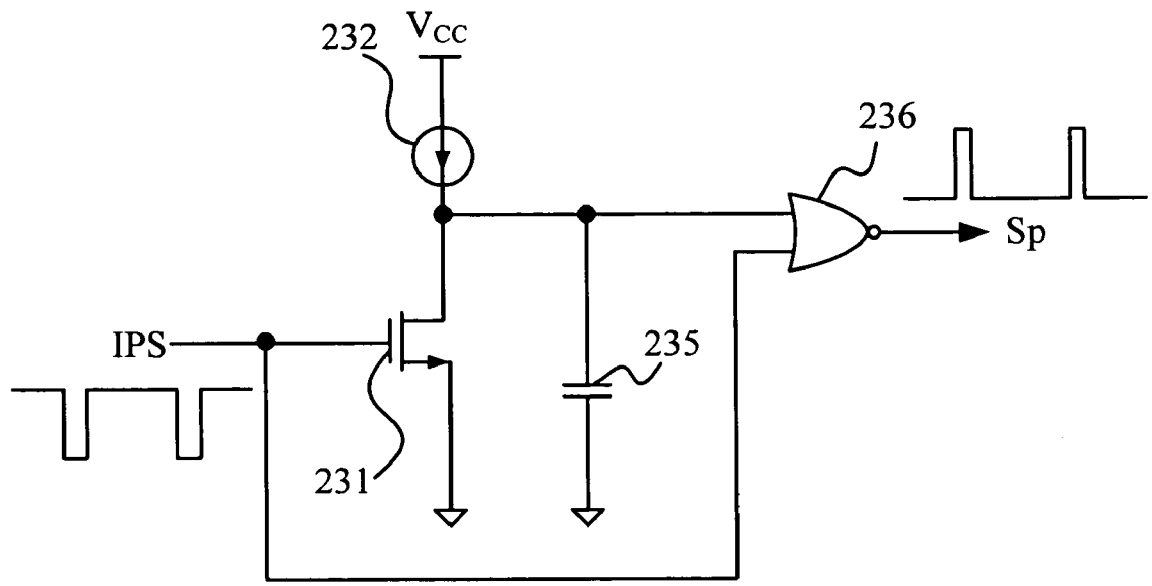
FIG. 8 shows a circuit schematic of a preferred embodiment of a pulse generator according to the present invention.

FIG. 8 shows the schematic circuit diagram of the pulse generator 230. The pulse generator 230 comprises a constant current-source 232, a transistor 231, a capacitor 235 and an NOR gate 236 to produce the pulse signal $S_P$ in response to the falling edge of the oscillation signal IPS. The gate of the transistor 231 is coupled to receive the oscillation signal IPS. The oscillation signal IPS is used to control the transistor 231. The source of the transistor 231 is coupled to the ground. The constant current-source 232 is coupled between the drain of the transistor 231 and the supply voltage $V_{CC}$. The capacitor 235 is coupled from the drain of the transistor 231 to the ground. The input terminals of the NOR gate 236 are coupled to the capacitor 235 and the oscillation signal IPS respectively. The pulse signal $S_P$ is generated at the output terminal of the NOR gate 236. The constant current-source 232 is used to charge the capacitor 235 when the transistor 231 is turned off in response to the falling edge of the oscillation signal IPS. The pulse signal $S_P$ is enabled during charging the capacitor 235. The current of the constant current-source 232 and the capacitance of the capacitor 235 determine the pulse width of the pulse signal $S_P$.

Figure 9:
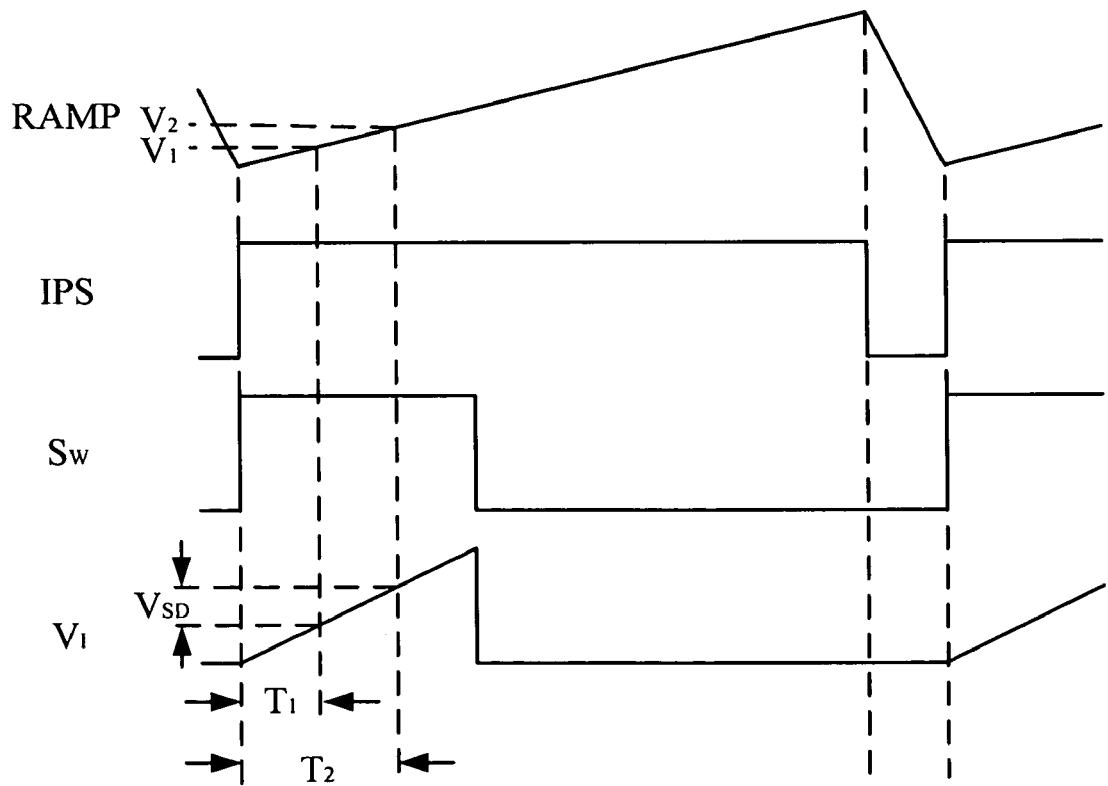
FIG. 9 shows signal-waveforms of the switching controller according to the present invention.

FIG. 9 shows signal-waveforms. The oscillation circuit 100 generates the timing signals $S_1$ and $S_2$ in accordance with threshold voltages $V_1$ and $V_2$ respectively (shown in the FIG. 5). The first timing signal $S_1$ includes the first period $T_1$. The second timing signal $S_2$ has the second period $T_2$. The detection circuit 210 samples the current signal $V_I$ during the first period $T_1$ to generate the first signal (shown in the FIG. 7). Sampling the current signal $V_I$ during the second period $T_2$ generates the second signal. The slope signal $V_{SD}$ is determined in accordance with differential voltage of the first signal and the second signal.

Figure 10:
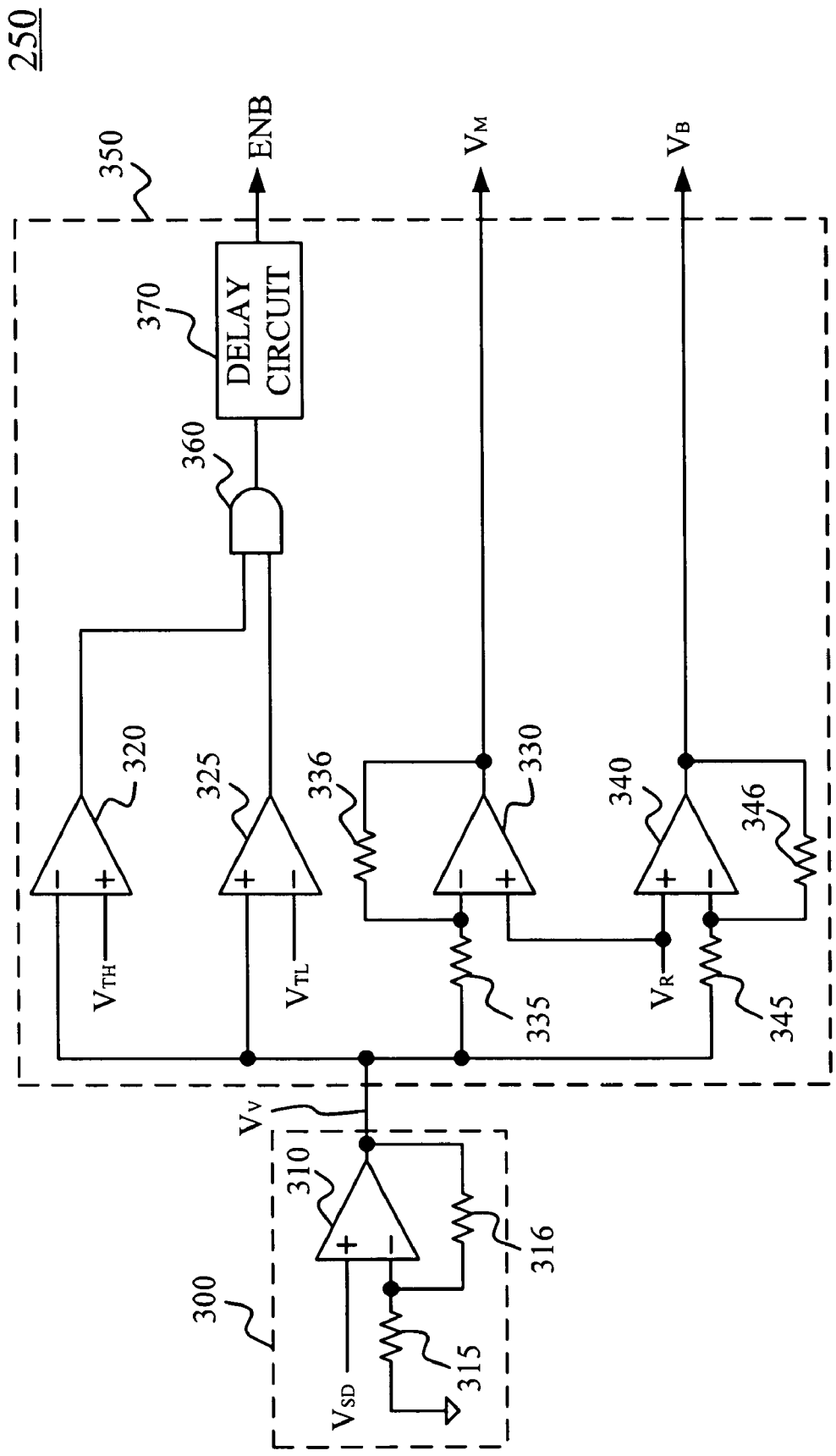
FIG. 10 shows the circuit diagram of a preferred embodiment of a $V_{IN}$ signal generator and a protection signal generator according to the present invention.

FIG. 10 shows the circuit diagram of the signal generation circuit 250. It includes a $V_{IN}$ signal generator 300 and a protection signal generator 350. The $V_{IN}$ signal generator 300 has an operational amplifier 310 coupled to amplify the slope signal $V_{SD}$ for generating the input-voltage signal $V_V$. The positive input terminal of the operational amplifier 310 is coupled to receive the slope signal $V_{SD}$. A resistor 315 is coupled between the negative input terminal of the operational amplifier 310 and the ground. A resistor 316 is coupled from the negative input terminal of the operational amplifier 310 to the output terminal of the operational amplifier 310. Resistors 315 and 316 determine the gain of the amplification.

The protection signal generator 350 includes comparators 320, 325 and operational amplifiers 330, 340 coupled to receive the input-voltage signal $V_V$. A resistor 335 is coupled between the negative input terminal of the operational amplifier 330 and the input-voltage signal $V_V$. A resistor 336 is coupled from the negative input terminal of the operational amplifier 330 to the output terminal of the operational amplifier 330. Resistors 335 and 336 determine the gain for operational amplifier 330. A resistor 345 is coupled between the negative input terminal of the operational amplifier 340 and the input-voltage signal $V_V$. A resistor 346 is coupled from the negative input terminal of the operational amplifier 340 to the output terminal of the operational amplifier 340. Resistors 345 and 346 determine the gain for operational amplifier 340. A reference voltage $V_R$ connects the positive input terminals of the operational amplifiers 330 and 340.

Threshold voltages $V_{TH}$ and $V_{TL}$ are coupled to the positive input terminal of the comparator 320 and the negative input terminal of the comparator 325 respectively. The negative input terminal of the comparator 320 is coupled to receive the input-voltage signal $V_V$. The comparator 320 is used to detect the over-voltage of the input-voltage signal $V_V$. The positive input terminal of the comparator 325 is coupled to receive the input-voltage signal $V_V$. The comparator 325 is used to detect the under-voltage of the input-voltage signal $V_V$. Input terminals of an AND gate 360 are connected to the output terminals of the comparators 320 and 325. The output terminal of the AND gate 360 generates the control signal ENB through a delay circuit 370. The delay circuit 370 provides a time delay for the disable of the control signal ENB when the over-voltage or the under-voltage of the input-voltage signal $V_V$ is occurred.

The operational amplifier 330 produces the current-limit signal $V_M$. The operational amplifier 340 generates the blanking adjustment signal $V_B$. The current-limit signal $V_M$ is decreased in response to the increase of the input-voltage signal $V_V$. The blanking adjustment signal $V_B$ is increased in response to the decrease of the input-voltage signal $V_V$.

Figure 11:
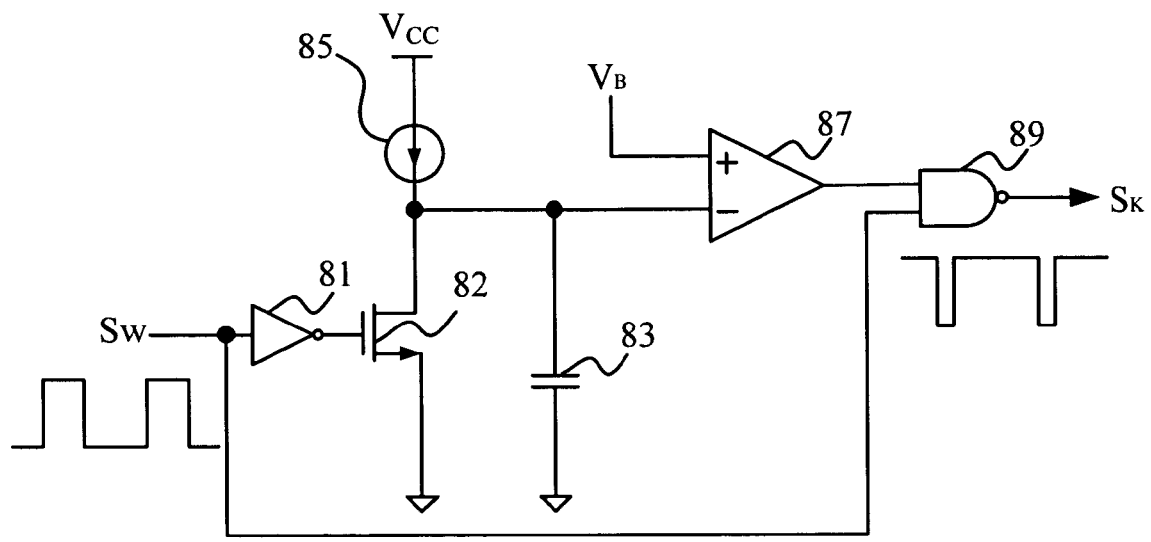
FIG. 11 shows a circuit schematic of a preferred embodiment of a blanking circuit according to the present invention.

FIG. 11 shows a circuit schematic of the blanking circuit 80. The blanking circuit 80 includes a constant current-source 85, a transistor 82, a capacitor 83, a comparator 87, an inverter 81 and an NAND gate 89 to produce the blanking signal $S_K$ in response to the rising edge of the switching signal $S_W$. The constant current-source 85 is coupled from the supply voltage $V_{CC}$ to the drain of the transistor 82. The gate and the source of the transistor 82 are coupled to the output terminal of the inverter 81 and the ground respectively. The capacitor 83 is coupled between the drain of the transistor 82 and the ground. The switching signal $S_W$ is coupled to the input terminal of the inverter 81 to control the transistor 82 through the inverter 81. Therefore the constant current-source 85 will start to charge the capacitor 83 once the switching signal $S_W$ is turned on.

The capacitor 83 is connected to the negative input terminal of the comparator 87 to compare with the blanking adjustment signal $V_B$ coupled to the positive input terminal of the comparator 87. The output terminal of the comparator 87 is connected to the input terminal of the NAND gate 89. Another input terminal of the NAND gate 89 is connected to the switching signal $S_W$. The blanking signal $S_K$ is thus generated at the output terminal of the NAND gate 89. The current of the constant current-source 85, the capacitance of the capacitor 83 and level of the blanking adjustment signal $V_B$ determine the blanking time of the blanking signal $S_K$. The blanking time of the blanking signal $S_K$ is therefore increased in response to the decrease of the input voltage $V_{IN}$.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A circuit for detecting an input voltage of a power converter, comprising:
   a current sense circuit generating a current signal in response to a switching current of an inductance device;
   a detection circuit coupled to sense a slope of the current signal; and
   a signal generation circuit generating an input-voltage signal in accordance with the slope of the current signal;
   wherein the level of the input-voltage signal is corrected to the input voltage of the power converter.

2. The circuit as claimed in claim 1, wherein the slope of the current signal is sensed when a power transistor of the power converter is turned on.

3. The circuit as claimed in claim 1, wherein a first signal is generated by the detection circuit sampling the current signal during a first period when a power transistor of the power converter is turned on, a second signal is generated by the detection circuit sampling the current signal during a second period when the power transistor is turned on, the slope of the current signal is determined in accordance with the first signal and the second signal.

4. The circuit as claimed in claim 1, wherein the detection circuit comprises:
   a first capacitor coupled to sample-and-hold the current signal through a first switch during a first period after a power transistor of the power converter being turned on;
   a second capacitor coupled to sample-and-hold the current signal through a second switch during a second period after the power transistor being turned on; and
   a third capacitor coupled to sample-and-hold the differential voltage of the first capacitor and the second capacitor for generating a slope signal;
   wherein the slope signal is correlated to the slope of the current signal.

5. The circuit as claimed in claim 4, wherein the first switch is controlled by a first sample signal, the second switch is controlled by a second sample signal, the first sample signal and the second sample signal are generated by an oscillation circuit of the power converter.

6. The circuit as claimed in claim 5, wherein the oscillation circuit further generates an oscillation signal coupled to enable the power transistor, the first sample signal and the second sample signal are synchronized with the oscillation signal.

7. The circuit as claimed in claim 1, wherein the signal generation circuit comprises:
   an operational amplifier coupled to amplify the slope of the current signal for generating the input-voltage signal.

8. The circuit as claimed in claim 1, wherein the inductive device is a transformer.

9. An input voltage detection method for detecting an input voltage of a power converter, comprising:
   generating a current signal in response to a switching current of an inductance device;
   detecting the waveform of the current signal to generate a slope signal; and
   generating an input-voltage signal in accordance with the slope signal, the level of the input-voltage signal corrected to the input voltage of the power converter.

10. The input voltage detection method as claimed in claim 9, wherein the slope signal is correlated to a slope of the switching current.

11. The input voltage detection method as claimed in claim 9, further comprising:
    sampling the current signal during a first period to generate a first signal when a power transistor of the power converter being turned on;
    sampling the current signal during a second period to generate a second signal when the power transistor being turned on; and
    generating the slope signal in accordance with the first signal and the second signal.

12. The input voltage detection method as claimed in claim 9, wherein the inductive device is a transformer.

13. A circuit for detecting an input voltage of a power converter, comprising:
    a detection circuit coupled to sense a switching current of an inductance device for generating a slope signal; and
    a signal generation circuit generating an input-voltage signal in accordance with the slope signal;
    wherein the level of the input-voltage signal is corrected to the input voltage of the power converter.

14. The circuit as claimed in claim 13, wherein the slope signal is correlated to a slope of the switching current.

15. The circuit as claimed in claim 13, wherein a first signal is generated by the detection circuit sampling the switching current during a first period when a power transistor of the power converter is turned on, a second signal is generated by the detection circuit sampling the switching current signal during a second period when the power transistor is turned on, the slope signal is determined in accordance with the first signal and the second signal.

16. The circuit as claimed in claim 13, wherein the detection circuit, comprises:
    a first capacitor coupled to sample-and-hold the switching current through a first switch during a first period after a power transistor of the power converter being turned on;
    a second capacitor coupled to sample-and-hold the switching current through a second switch during a second period after the power transistor being turned on; and
    a third capacitor coupled to sample-and-hold the differential voltage of the first capacitor and the second capacitor for generating the slope signal;
    wherein the slope signal is correlated to a slope of the switching current.

17. The circuit as claimed in claim 16, wherein the first switch is controlled by a first sample signal, the second switch is controlled by a second sample signal, the first sample signal and the second sample signal are generated by an oscillation circuit of the power converter.

18. The circuit as claimed in claim 17, wherein the oscillation circuit further generates an oscillation signal coupled to enable the power transistor, the first sample signal and the second sample signal are synchronized with the oscillation signal.

19. The circuit as claimed in claim 13, wherein the signal generation circuit comprises:
    an operational amplifier coupled to amplify the slope signal for generating the input-voltage signal.

* * * * *